United States Patent
Seo et al.

(10) Patent No.: US 11,503,727 B2
(45) Date of Patent: Nov. 15, 2022

(54) DISPLAY DEVICE

(71) Applicant: Samsung Display Co., LTD., Yongin-si (KR)

(72) Inventors: Dongwoo Seo, Suwon-si (KR); Dongjin Park, Seongnam-si (KR); Jaiku Shin, Hwaseong-si (KR); Sung Chul Choi, Hwaseong-si (KR)

(73) Assignee: Samsung Display Co., LTD., Yongin-si (KR)

( * ) Notice: Subject to any disclaimer, the term of this patent is extended or adjusted under 35 U.S.C. 154(b) by 35 days.

(21) Appl. No.: 17/114,141

(22) Filed: Dec. 7, 2020

(65) Prior Publication Data

US 2021/0259119 A1     Aug. 19, 2021

(30) Foreign Application Priority Data

Feb. 14, 2020   (KR) ................. 10-2020-0018529
Feb. 26, 2020   (KR) ................. 10-2020-0023759

(51) Int. Cl.
    *H05K 7/02*        (2006.01)
    *H05K 7/04*        (2006.01)
    *H05K 5/02*        (2006.01)
    *H05K 5/00*        (2006.01)
         (Continued)

(52) U.S. Cl.
CPC ......... *H05K 5/0217* (2013.01); *H05K 5/0017* (2013.01); *H01L 25/0753* (2013.01); *H01L 51/5237* (2013.01); *H01L 2251/5338* (2013.01)

(58) Field of Classification Search
USPC ................. 361/807, 755, 809, 810
See application file for complete search history.

(56) References Cited

U.S. PATENT DOCUMENTS

| | | | |
|---|---|---|---|
| 10,074,824 B2 | 9/2018 | Han et al. | |
| 2013/0216740 A1* | 8/2013 | Russell-Clarke | B23K 26/38 219/121.72 |
| 2016/0357052 A1* | 12/2016 | Kim | G06F 1/1652 |

(Continued)

FOREIGN PATENT DOCUMENTS

| | | |
|---|---|---|
| JP | 2010-266777 | 11/2010 |
| KR | 10-2016-0017843 | 2/2016 |

(Continued)

OTHER PUBLICATIONS

Extended European Search Report dated Jun. 29, 2021, issued to European Patent Application No. 21150856.9.

*Primary Examiner* — Hung S. Bui
(74) *Attorney, Agent, or Firm* — H.C. Park & Associates, PLC

(57) ABSTRACT

A display device includes: a display module having a first non-foldable area, a foldable area, and a second non-foldable area, which are arranged in a first direction in a unfolded state; and a first support layer disposed under the display module and having a lattice pattern including a plurality of first holes overlapping the foldable area, wherein the first holes are arranged in the first direction and a second direction intersecting the first direction, and wherein: each of the first holes has a first width in the second direction and a second width in the first direction, the first width is in a range from about 2,000 μm to about 9,000 μm, and the second width is in a range from about 100 μm to about 250 μm.

15 Claims, 10 Drawing Sheets

(51) Int. Cl.
*H01L 25/075* (2006.01)
*H01L 51/52* (2006.01)

(56) References Cited

U.S. PATENT DOCUMENTS

| | | | |
|---|---|---|---|
| 2017/0068275 | A1 | 3/2017 | Lee et al. |
| 2017/0194580 | A1* | 7/2017 | Lee .................... H01L 51/5253 |
| 2018/0097197 | A1* | 4/2018 | Han ...................... G06F 1/1677 |
| 2019/0036068 | A1* | 1/2019 | Kim ..................... G06F 1/1652 |
| 2019/0132987 | A1 | 5/2019 | Koo et al. |
| 2019/0196548 | A1* | 6/2019 | Kim ........................ G09F 9/301 |
| 2020/0411777 | A1 | 12/2020 | Seo et al. |

FOREIGN PATENT DOCUMENTS

| | | |
|---|---|---|
| KR | 10-2016-0144912 | 12/2016 |
| KR | 10-2018-0036904 | 4/2018 |
| KR | 10-2019-0003257 | 1/2019 |
| KR | 10-2021-0000809 | 1/2021 |

\* cited by examiner

DISPLAY DEVICE

CROSS-REFERENCE TO RELATED APPLICATION

This application claims priority from and the benefit of Korean Patent Application Nos. 10-2020-0018529, filed on Feb. 14, 2020 and 10-2020-0023759, filed on Feb. 26, 2020, which are hereby incorporated by reference for all purposes as if fully set forth herein.

BACKGROUND

Field

Exemplary implementations of the invention relate generally to a display device and more specifically, to a display device having a foldable area.

Discussion of the Background

Electronic devices that provide an image to a user, such as a smart phone, a digital camera, a notebook computer, a navigation unit, and a smart television, include a display device to display the image. The display device generates the image and provides the image to the user through a display screen.

In recent years, various flexible display devices have been investigated that are deformable into a curved shape, bendable, or rollable. The flexible display devices that are deformable into various shapes are easy to carry and improve a user's convenience.

Among the flexible display devices, a foldable display device includes a display module folded about a folding axis extending in one direction. The display module is folded or unfolded about the folding axis.

The above information disclosed in this Background section is only for understanding of the background of the inventive concepts, and, therefore, it may contain information that does not constitute prior art.

SUMMARY

Applicant has discovered that display devices having a foldable display panel are damaged by repeated folding and unfolding operations. Specifically, Applicant has realized that a support layer for supporting the foldable display panel is easily damaged by the repeated folding and unfolding operations because the support layer is folded and unfolded with the foldable display panel.

Display devices constructed according to the principles and exemplary implementations of the invention are capable of reducing stress and defects of the support layer for supporting the foldable display panel by providing a lattice pattern including a plurality of holes therein.

In addition, display devices constructed according to the principles and exemplary implementations of the invention has a support layer with characteristics appropriate to a foldable display device.

Additional features of the inventive concepts will be set forth in the description which follows, and in part will be apparent from the description, or may be learned by practice of the inventive concepts.

According to one or more exemplary embodiments of the invention, a display device includes: a display module having a first non-foldable area, a foldable area, and a second non-foldable area, which are arranged in a first direction in a unfolded state; and a first support layer disposed under the display module and having a lattice pattern including a plurality of first holes overlapping the foldable area, wherein the first holes are arranged in the first direction and a second direction intersecting the first direction, and wherein: each of the first holes has a first width in the second direction and a second width in the first direction, the first width is in a range from about 2,000 µm to about 9,000 µm, and the second width is in a range from about 100 µm to about 250 µm.

An end of the first supporting layer may protrude outward beyond an end of the display module.

The lattice pattern may include: a plurality of first branches disposed between the first holes adjacent to each other in the first direction and extending in the second direction; and a plurality of second branches disposed between the first holes adjacent to each other in the second direction and extending in the first direction.

Each of the first branches may have a third width in the first direction, and the third width may be in a range from about 100 µm to about 200 µm.

Each of the second branches may have a fourth width in the second direction, and the fourth width may be in a range from about 121 µm to about 200 µm.

The first width may be about 5,350 µm, the second width may be about 150 µm, and the third width may be about 100 µm.

Each of the first branches may have a hexagonal shape in a cross-section when viewed in the second direction.

A width of an upper surface of the first branch may be equal to a width of a lower surface of the first branch when viewed in the second direction, and the width of the upper surface of the first branch may be smaller than a third width corresponding to a width of a center portion of the first branch.

The first support layer may include a metal material.

The first support layer may include: a first portion disposed under the first non-foldable area and extending in the first direction from the lattice pattern; and a second portion disposed under the second non-foldable area and extending in the first direction from the lattice pattern.

Center points of the first holes adjacent to each other in the first direction may be shifted in the second direction and spaced apart from each other.

The display device may further include a second support layer disposed under the first support layer, wherein the second support layer may include: a first plate overlapping the first non-foldable area; and a second plate overlapping the second non-foldable area and spaced apart from the first plate in the first direction.

The display device may further include a sub-cover layer disposed between the first support layer and the second support layer and folded or unfolded integrally with the first support layer.

The display module may be inwardly folded such that an upper surface of the first non-foldable area and an upper surface of the second non-foldable area face each other when the display module is folded about a folding axis in the foldable area.

A plurality of second holes may be further defined in the lattice pattern, the second holes may be arranged in the first direction and the second direction and disposed between the first holes adjacent to each other in the first direction, and a width of each second hole in the second direction of each of the second holes may be smaller than the first width of each first hole in the second direction.

The lattice pattern may include a plurality of first branches disposed between the first holes adjacent to each other in the first direction and extending in the second direction, the second holes arranged in the second direction may be defined in each of the first branches, and a width of each first branch in the first direction may be greater than the second width of each first hole in the first direction.

A distance between the second holes adjacent to each other in the second direction may be smaller than the first width of each first hole in the second direction.

Center points of the second holes adjacent to each other in the first direction may be disposed at same positions in the second direction.

According to one or more exemplary embodiments of the invention, a display device includes: a display module having a first non-foldable area, a foldable area, and a second non-foldable area, which are arranged in a first direction in a unfolded state; a first support layer disposed under the display module and having a lattice pattern including a plurality of first holes, the plurality of first holes overlapping the foldable area of the display module; and a second support layer disposed under the first support layer and including a first plate disposed under the first non-foldable area and a second plate disposed under the second non-foldable area, the second plate separated from the first plate, wherein: in the unfolded state, the first plate and the second plate overlap the foldable area of the display module in a second direction intersecting the first direction, and in a folded state, the first plate and the second plate do not overlap the foldable area of the display module in the second direction.

The plurality of first holes may be arranged in the first direction and a third direction intersecting the first direction, and wherein: each of the first holes may have a first width in the third direction and a second width in the first direction, the first width may be in a range from about 2,000 μm to about 9,000 μm, and the second width may be in a range from about 100 μm to about 250 μm.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
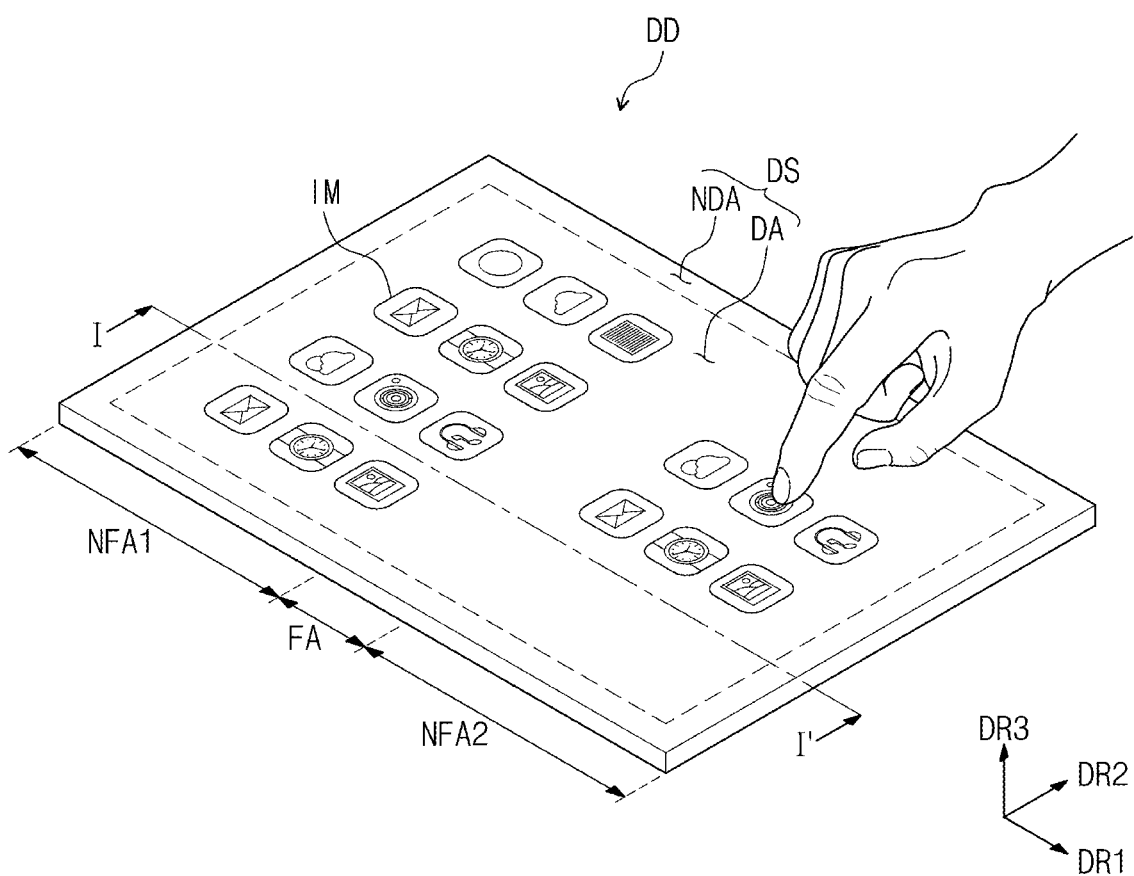
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art. Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of an exemplary embodiment of a display device DD constructed according to the principles of the invention.

Referring to FIG. 1, the display device DD according to the exemplary embodiment may have a rectangular shape defined by long sides extending in a first direction DR1 and short sides extending in a second direction DR2 intersecting the first direction DR1. However, the shape of the display device DD should not be limited to the rectangular shape, and the display device DD may have a variety of shapes, such as a circular shape or a polygonal shape.

Hereinafter, a direction substantially perpendicular to a plane defined by the first direction DR1 and the second direction DR2 may be referred to as a "third direction DR3". In the following descriptions, the expression "when viewed in a plane" means a state of being viewed in the third direction DR3.

The display device DD may include a first non-foldable area NFA1, a second non-foldable area NFA2, and a foldable area FA disposed between the first non-foldable area NFA1 and the second non-foldable area NFA2. The first non-foldable area NFA1, the second non-foldable area NFA2, and the foldable area FA may be arranged in the first direction DR1.

As an example, one foldable area FA and two non-foldable areas NFA1 and NFA2 are shown in FIG. 1, however, the number of the foldable areas FA and the number of the non-foldable areas NFA1 and NFA2 should not be limited thereto or thereby. For example, the display device DD may include more than two non-foldable areas and a plurality of foldable areas disposed between the non-foldable areas.

An upper surface of the display device DD may be defined as a display surface DS and may be a plane defined by the first direction DR1 and the second direction DR2. Images IM generated by the display device DD may be provided to a user through the display surface DS.

The display surface DS may include a display area DA and a non-display area NDA around the display area DA. The display area DA may display the image, and the non-display area NDA may not display the image. The non-display area NDA may surround the display area DA and may be defined as an edge of the display device DD, which is printed with a predetermined color.

Figure 2:
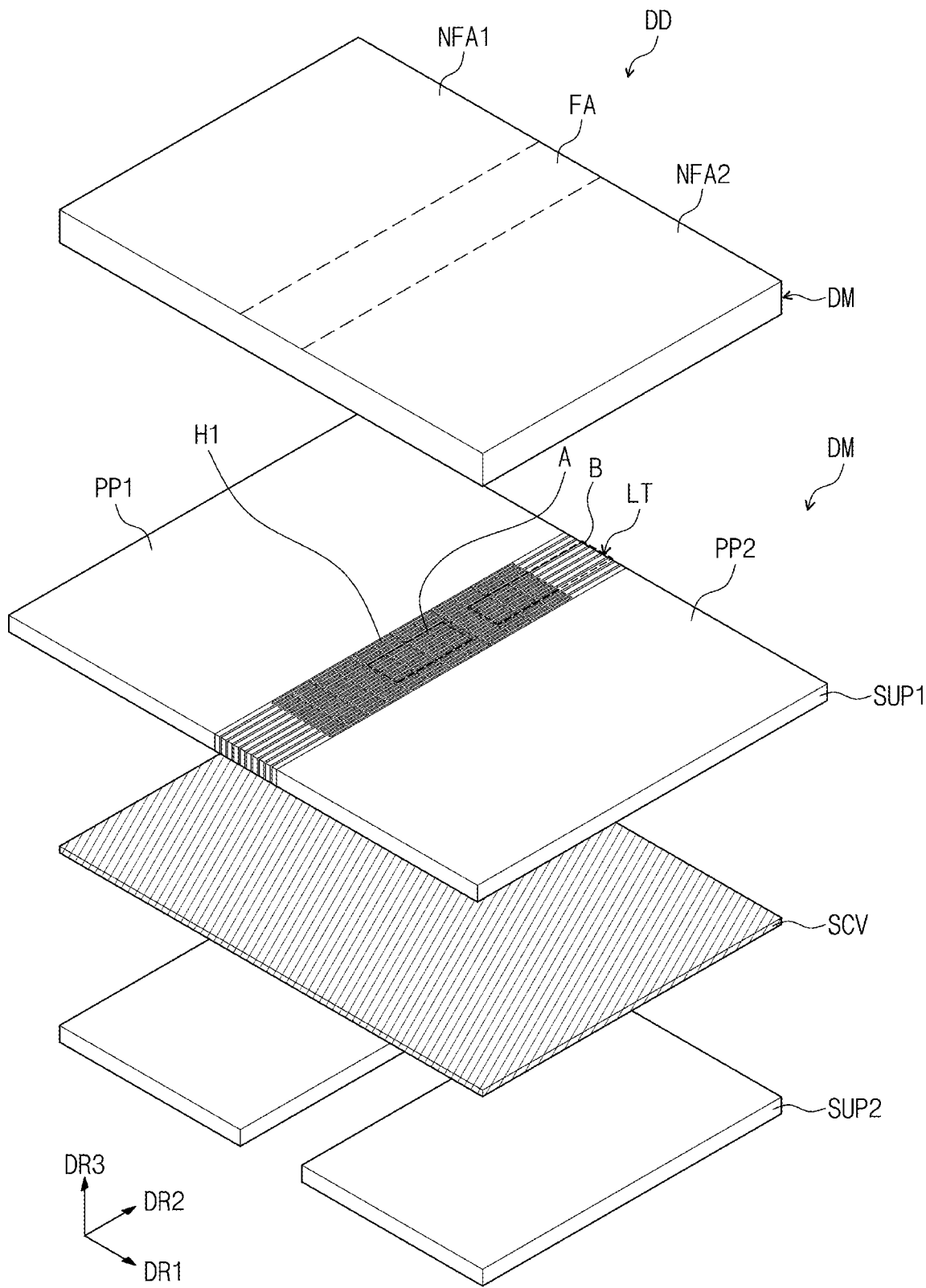
FIG. 2 is an exploded perspective view of the display device of FIG. 1.
Figure 3:
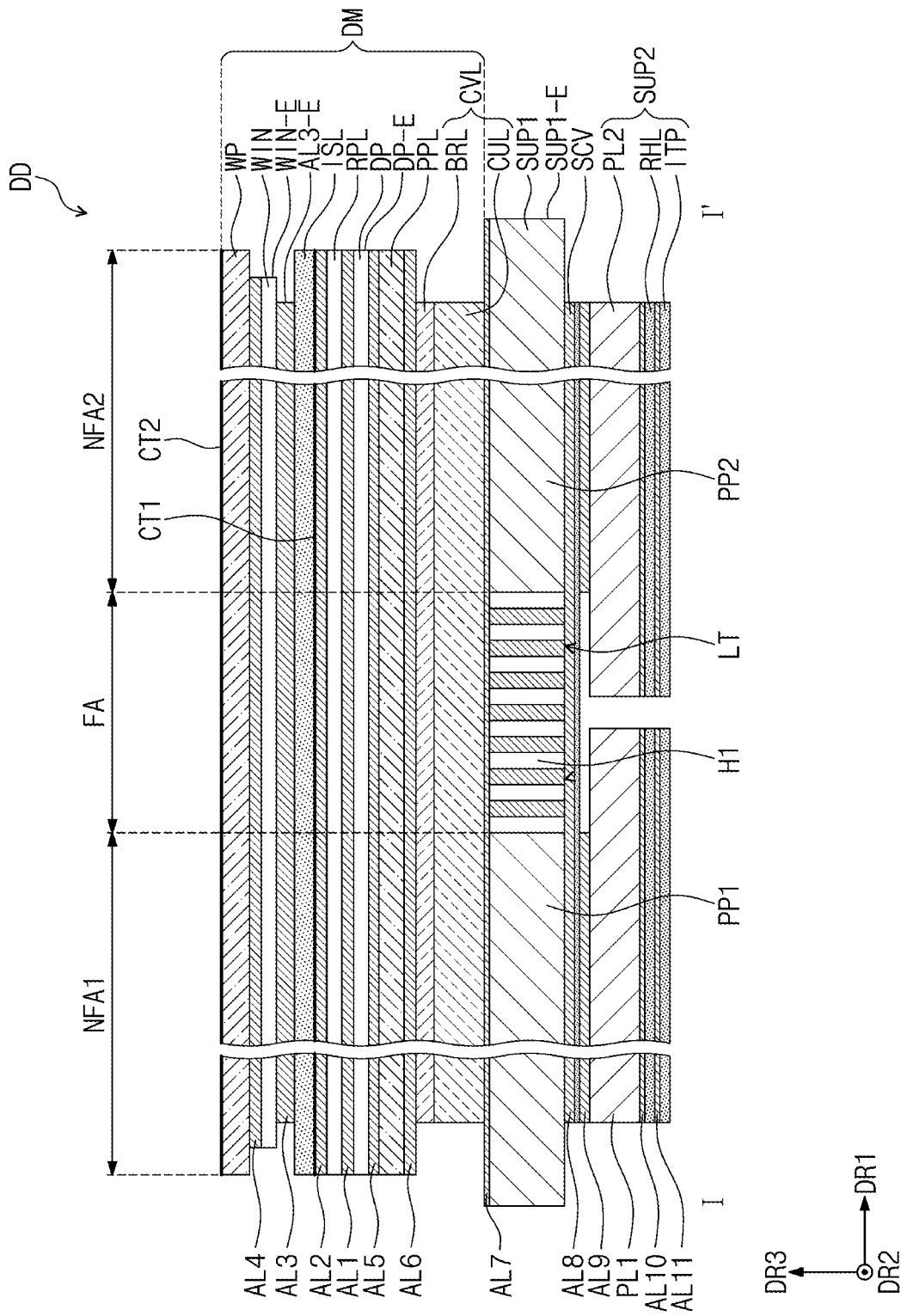
FIG. 3 is a cross-sectional view taken along a line I-I' of FIG. 1.
Figure 4:
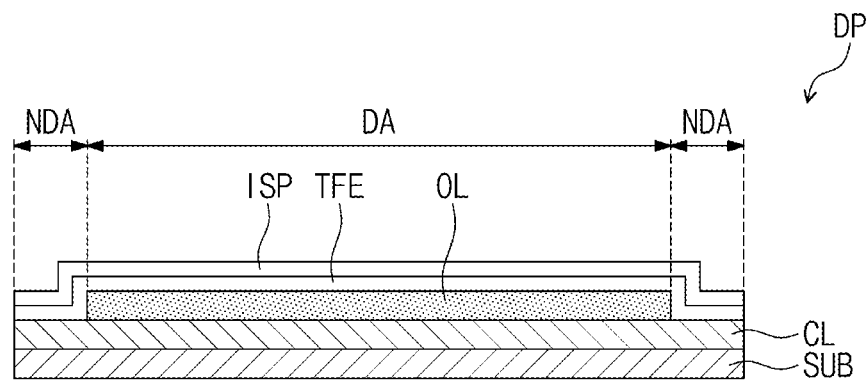
FIG. 4 is a cross-sectional view of a display panel of a display module of the display device of FIG. 1.

FIG. 2 is an exploded perspective view of the display device DD of FIG. 1, FIG. 3 is a cross-sectional view taken along a line I-I' of FIG. 1, and FIG. 4 is a cross-sectional view of a display panel of a display module of the display device of FIG. 1. For the convenience of explanation, a plurality of adhesive layers is omitted in FIG. 2.

Referring to FIGS. 2 and 3, the display device DD according to the exemplary embodiment may include a display module DM, a first support layer SUP1, a sub-cover layer SCV, and a second support layer SUP2. The display module DM, the first support layer SUP1, the sub-cover layer SCV, and the second support layer SUP2 may be sequentially stacked in the third direction DR3.

The display module DM may be a flexible display module. The display module DM includes a first non-foldable area NFA1, a foldable area FA, and a second non-foldable area which are arranged in the first direction DR1.

The display module DM may include a display panel DP, an anti-reflection layer RPL, an impact absorbing layer ISL, a window WIN, a window protection layer WP, a first coating layer CT1, a second coating layer CT2, a panel protection layer PPL, a cover layer CVL, and a plurality of adhesive layers. Each layer of the display module DM may comprises a first non-foldable area NFA1, a foldable area FA, and a second non-foldable area.

The anti-reflection layer RPL, the impact absorbing layer ISL, the window WIN, the window protection layer WP, the first coating layer CT1, and the second coating layer CT2 may be disposed above the display panel DP.

The anti-reflection layer RPL may be disposed on the display panel DP. The anti-reflection layer RPL may be an external light anti-reflection film. The anti-reflection layer RPL may reduce a reflectance of an external light incident to the display panel DP from the above of the display device DD. As an example, the anti-reflection layer RPL may include a retarder and/or a polarizer.

The anti-reflection layer RPL may have a thickness greater than a thickness of the display panel DP in the third direction DR3. For example, the thickness in the third direction DR3 of the display panel DP may be about 30 μm, and the thickness in the third direction DR3 of the anti-reflection layer RPL may be about 31 μm. However, the thickness of the anti-reflection layer RPL should not be limited thereto or thereby. The anti-reflection layer RPL may have a thickness smaller than that of the display panel DP.

A first adhesive layer AL1 may be disposed between the anti-reflection layer RPL and the display panel DP. The anti-reflection layer RPL may be attached to the display panel DP by the first adhesive layer AL1. The first adhesive layer AL1 may have a thickness smaller than that of the display panel DP in the third direction DR3. For instance, the thickness in the third direction DR3 of the first adhesive layer AL1 may be about 25 μm.

The impact absorbing layer ISL may be disposed on the anti-reflection layer RPL. The impact absorbing layer ISL may absorb impacts applied to the display panel DP from the outside of the display device DD. The impact absorbing layer ISL may include a flexible plastic material. For example, the impact absorbing layer ISL may include polyimide (PI) or polyethylene terephthalate (PET). The impact absorbing layer ISL may have an elastic modulus equal to or greater than about 1 GPa.

The impact absorbing layer ISL may have a thickness greater than that of the anti-reflection layer RPL in the third direction DR3. As an example, the thickness in the third direction DR3 of the impact absorbing layer ISL may be about 41 μm.

The first coating layer CT1 may be coated on a lower surface of the impact absorbing layer ISL. The first coating layer CT1 may include a hard coating layer. The first coating layer CT1 may planarize the lower surface of the impact absorbing layer ISL, which may be a curved surface.

A second adhesive layer AL2 may be disposed between the impact absorbing layer ISL and the anti-reflection layer RPL. The impact absorbing layer ISL and the anti-reflection layer RPL may be attached to each other by the second adhesive layer AL2. When viewed in the third direction DR3, the second adhesive layer AL2 may have a thickness that is smaller than the thickness of the anti-reflection layer RPL and equal to the thickness of the first adhesive layer AL1. As an example, the thickness in the third direction DR3 of the second adhesive layer AL2 may be about 25 μm.

The window WIN may be disposed on the impact absorbing layer ISL. The window WIN may protect the display panel DP and the anti-reflection layer RPL from scratches. The image generated by the display panel DP may be provided to the user through the window WIN. The window WIN may have an optically transparent property. For example, the window WIN may include a glass material. In the illustrated exemplary embodiment, the window WIN may be an ultra-thin glass (UTG). However, the material of the window WIN should not be limited thereto or thereby. For instance, the window WIN may include a transparent plastic material.

The window WIN may have a single-layer or multi-layer structure. For example, the window WIN may include a plurality of synthetic resin films attached to each other by an adhesive or a glass substrate and a synthetic resin film attached to the glass substrate by an adhesive.

When viewed in a plane, the window WIN may have an area smaller than an area of the display panel DP. In detail, opposite ends DP-E of the display panel DP may protrude outward beyond opposite ends WIN-E of the window WIN in the first direction DR1. For example, each of the opposite ends DP-E of the display panel DP may protrude in the first direction DR1 more than a corresponding end WIN-E of the window WIN by about 150 μm or more. For example, opposite ends of the display panel DP may protrude outward beyond the opposite ends of the window WIN in the second direction DR2.

According to the exemplary embodiment, as the end WIN-E of the window WIN is disposed inside the end DP-E of the display panel DP, the window WIN may be effectively protected from external impacts acting on the display module DM.

The thickness in the third direction DR3 of the window WIN may be smaller than the thickness of each of the impact absorbing layer ISL and the anti-reflection layer RPL and may be equal to the thickness of the display panel DP. For example, the thickness of the window WIN may be about 30 μm in the third direction DR3.

A third adhesive layer AL3 may be disposed between the window WIN and the impact absorbing layer ISL. The window WIN and the impact absorbing layer ISL may be attached to each other by the third adhesive layer AL3. The third adhesive layer AL3 may have a thickness greater than the thickness of the window WIN and smaller than the thickness of the impact absorbing layer ISL. As an example, the thickness of the third adhesive layer AL3 may be about 35 μm in the third direction DR3.

When viewed in a plane, the third adhesive layer AL3 may have an area smaller than the area of the window WIN. In detail, the opposite ends WIN-E of the window WIN may protrude outward beyond opposite ends AL3-E of the third adhesive layer AL3 in the first direction DR1. For example, the opposite ends of the window WIN may protrude outward beyond the opposite ends of the third adhesive layer AL3 in the second direction DR2.

According to the exemplary embodiment, as the end AL3-E of the third adhesive layer AL3 disposed under the window WIN is disposed inside the end WIN-E of the window WIN, the window WIN may be more easily folded. The window protection layer WP may be disposed on the window WIN. The first coating layer CT1 may be coated on an upper surface of the window protection layer WP. The window protection layer WP and the second coating layer CT2 may protect the window WIN.

The window protection layer WP may include a flexible plastic material such as polyimide or polyethylene terephthalate. The first coating layer CT1 may include a hard coating layer, however, exemplary embodiments are not limited thereto or thereby. The first coating layer CT1 may further include an anti-fingerprint layer or a scatter prevention layer which is used as a functional layer.

The window protection layer WP may have a thickness greater than the thickness of the impact absorbing layer ISL in the third direction DR3. As an example, the thickness of the window protection layer WP in the third direction DR3 may be about 55 μm.

A fourth adhesive layer AL4 may be disposed between the window protection layer WP and the window WIN. The window protection layer WP and the window WIN may be attached to each other by the fourth adhesive layer AL4. The fourth adhesive layer AL4 may have a thickness smaller than the thickness of the window WIN in the third direction DR3. As an example, the thickness in the third direction DR3 of the fourth adhesive layer AL4 may be about 25 μm.

The panel protection layer PPL and the cover layer CVL may be disposed under the display panel DP. The panel protection layer PPL may be disposed under the display panel DP. The panel protection layer PPL may include a flexible material. For example, the panel protection layer PPL may include polyethylene terephthalate (PET).

The panel protection layer PPL may have a thickness greater than the thickness of the display panel DP in the third direction DR3. As an example, the thickness in the third direction DR3 of the panel protection layer PPL may be about 50 μm.

A fifth adhesive layer AL5 may be disposed between the display panel DP and the panel protection layer PPL. The display panel DP and the panel protection layer PPL may be attached to each other by the fifth adhesive layer AL5. The fifth adhesive layer AL5 may have a thickness smaller than the thickness of the display panel DP. As an example, the thickness in the third direction DR3 of the fifth adhesive layer AL5 may be about 18 μm.

The cover layer CVL may be disposed under the panel protection layer PPL. The cover layer CVL may define a lower portion of the display module DM. The cover layer CVL may absorb external impacts applied to the lower portion of the display module DM. When viewed in a plane, the cover layer CVL may have an area smaller than the area of the display panel DP. The opposite ends of the display panel DP may protrude outward beyond opposite ends of the cover layer CVL in the first direction DR1. For example, each of the opposite ends of the display panel DP may protrude in the first direction DR1 more than a corresponding end of the opposite ends of the cover layer CVL by about 200 μm or more. For example, the opposite ends of the display panel DP may protrude outward beyond the opposite ends of the cover layer CVL in the second direction DR2.

The cover layer CVL may include a barrier layer BRL and a cushion layer CUL. The barrier layer BRL may be disposed under the panel protection layer PPL. The barrier layer BRL may increase a resistance to a compression force due to external pressure. As an example, the barrier layer BRL may prevent the display panel DP from being deformed. The barrier layer BRL may include a flexible plastic material such as polyimide or polyethylene terephthalate.

The cushion layer CUL may be disposed under the barrier layer BRL. The cushion layer CUL may absorb the external impacts applied to the lower portion of the display module DM and may protect the display module DM. The cushion layer CUL may include a foam sheet having a predetermined elasticity. The cushion layer CUL may include foam, sponge, polyurethane, or thermoplastic polyurethane. The cushion layer CUL may be formed directly on a lower surface of the barrier layer BRL that serves as a base layer.

The barrier layer BRL may have a thickness greater than the thickness of the display panel DP and smaller than the thickness of the panel protection layer PPL in the third direction DR3. As an example, the thickness in the third direction DR3 of the barrier layer BRL may be about 35 μm. The cushion layer CUL may have a thickness greater than the thickness of the panel protection layer PPL in the third direction DR3. As an example, the thickness in the third direction DR3 of the cushion layer CUL may be about 100 μm.

At least one layer of the barrier layer BRL and the cushion layer CUL may have a color that absorbs a light. For example, at least one layer of the barrier layer BRL and the cushion layer CUL may have a black color. In this case, when the display device DD is viewed in a plane, components disposed under the cover layer CVL may not be viewed.

A sixth adhesive layer AL6 may be disposed between the panel protection layer PPL and the barrier layer BRL. The panel protection layer PPL and the barrier layer BRL may be attached to each other by the sixth adhesive layer AL6. The sixth adhesive layer AL6 may have a thickness smaller than the thickness of the display panel DP and greater than the thickness of the fifth adhesive layer AL5 in the third direction DR3. For example, the thickness in the third direction DR3 of the sixth adhesive layer AL6 may be about 25 μm.

Referring to FIG. 4, the display panel DP may include a substrate SUB, a circuit element layer CL disposed on the substrate SUB, a display element layer OL disposed on the circuit element layer CL, a thin film encapsulation layer TFE disposed on the display element layer OL, and an input sensing unit ISP disposed on the thin film encapsulation layer TFE.

The substrate SUB may include a display area DA and a non-display area NDA around the display area DA. The substrate SUB may include a flexible plastic material. For example, the substrate SUB may include polyimide (PI).

The circuit element layer CL may include an insulating layer, a semiconductor pattern, a conductive pattern, and a signal line. An insulating layer, a semiconductor layer, and a conductive layer may be formed on the substrate SUB by coating and deposition processes, and then, the insulating layer, the semiconductor layer, and the conductive layer may be selectively patterned by a plurality of photolithography processes. Then, the semiconductor pattern, the conductive pattern, and the signal line of the circuit element layer CL may be formed.

The display element layer OL may be disposed on the display area DA. The display element layer OL may include a light emitting element. For example, the display element layer OL may include an organic light emitting material, a quantum dot, a quantum rod, or a micro-LED.

The thin film encapsulation layer TFE may be disposed on the circuit element layer CL to cover the display element layer OL. The thin film encapsulation layer TFE may include an inorganic layer, an organic layer, and an inorganic layer, which are sequentially stacked. The inorganic layers may include an inorganic material and may protect pixels from moisture, oxygen, or the like. The organic layer may include an organic material and may protect the pixels from a foreign substance, such as dust particles.

The input sensing unit ISP may include a plurality of sensors to sense an external input. The sensors may sense the external input by a capacitive method. The external input may include a variety of inputs caused by a part of user's body, a light, a heat, a pen, or a pressure.

The input sensing unit ISP may be manufactured directly on the thin film encapsulation layer TFE when the display panel DP is manufactured, however, the input sensing unit ISP is not limited thereto or thereby. The input sensing unit ISP may be attached to the display panel DP by an adhesive layer after being manufactured separately from the display panel DP.

Referring to FIGS. 2 and 3 again, the first support layer SUP1 may be disposed under the display module DM. For example, the first support layer SUP1 may be disposed under the cushion layer CUL of the cover layer CVL. The first support layer SUP1 may support the display module DM. In addition, a heat dissipation performance of the display device DD may be improved by the first support layer SUP1.

The first support layer SUP1 may be a flexible layer. For example, the first support layer SUP1 may include a material having an elastic modulus of about 60 GPa or more. The first support layer SUP1 may include a metal material such as a stainless steel. For example, the first support layer SUP1 may include SUS 304, however, exemplary embodiments are not limited thereto or thereby. The first support layer SUP1 may include a variety of metal materials.

When viewed in a plane, the first support layer SUP1 may have an area greater than an area of the display module DM. In detail, opposite ends SUP1-E of the first support layer SUP1 may protrude outward beyond the opposite ends DP-E of the display panel DP in the first direction DR1. For example, each of the opposite ends SUP1-E of the first support layer SUP1 may protrude in the first direction DR1 beyond a corresponding end DP-E of the display panel DP by about 150 μm or more. For example, the opposite ends of the first support layer SUP1 may protrude outward beyond the opposite ends of the display panel DP in the second direction DR2.

According to the exemplary embodiment, since an edge portion of the first support layer SUP1 protrudes outward beyond the display module DM, the first support layer SUP1 may effectively protect the display module DM from external impacts applied thereto from the outside of the display device DD.

The first support layer SUP1 may include a first portion PP1, a second portion PP2, and a lattice pattern LT. The lattice pattern LT may be disposed between the first portion PP1 and the second portion PP2. The first portion PP1, the second portion PP2, and the lattice pattern LT may be integrally formed with each other. For example, each of the first portion PP1 and the second portion PP2 may extend from the lattice pattern LT in the first direction DR1.

The first portion PP1 may be disposed under the first non-foldable area NFA1 and may support the first non-foldable area NFA1. The second portion PP2 may be disposed under the second non-foldable area NFA2 and may support the second non-foldable area NFA2. The lattice pattern LT may be disposed under the foldable area FA. In the illustrated exemplary embodiment, a width in the first direction DR1 of the lattice pattern LT may be in a range from about 8.65 mm to about 9.65 mm. However, the width in the first direction DR1 of the lattice pattern LT is not limited thereto or thereby.

The lattice pattern LT may be provided with a plurality of first holes H1 formed by passing therethrough. The first holes H1 may penetrate through the first support layer SUP1 in the third direction DR3. A thickness in the third direction DR3 of the first holes H1 may be equal to a thickness of the first support layer SUP1. The lattice pattern LT may be easily folded with the display module DM in the foldable area FA due to the first holes H1. Detailed descriptions of the first holes H1 defined through the lattice pattern LT will be described later.

The first support layer SUP1 may have the thickness greater than the thickness of the cushion layer CUL of the cover layer CVL in the third direction DR3. For example, the thickness in the third direction DR3 of the first support layer SUP1 may be about 150 μm.

A seventh adhesive layer AL7 may be disposed between the cushion layer CUL and the first support layer SUP1. The cushion layer CUL and the first support layer SUP1 may be attached to each other by the seventh adhesive layer AL7. The seven adhesive layer AL7 may have a thickness smaller than the thickness of the fifth adhesive layer AL5 in the third direction DR3. As an example, the thickness in the third direction DR3 of the seventh adhesive layer AL7 may be about 8 μm.

The sub-cover layer SCV may be disposed under the first support layer SUP1. The sub-cover layer SCV may cover the first holes H1 defined through the lattice pattern LT of the first support layer SUP1. The sub-cover layer SCV may have flexibility. The sub-cover layer SCV may have an elastic modulus smaller than that of the first support layer SUP1. For example, the sub-cover layer SCV may include thermoplastic polyurethane or rubber, however, the material of the sub-cover layer SCV is not limited thereto or thereby.

The sub-cover layer SCV may be manufactured in a sheet form and may be attached to the first support layer SUP1. For example, an eighth adhesive layer AL8 may be disposed between the sub-cover layer SCV and the first support layer SUP1. The sub-cover layer SCV and the first support layer SUP1 may be attached to each other by the eighth adhesive layer AL8. The sub-cover layer SCV may prevent a foreign substance from entering the first holes H1 defined through the lattice pattern LT of the first support layer SUP1.

The second support layer SUP2 may be disposed under the sub-cover layer SCV. The second support layer SUP2 may support the first non-foldable area NFA1 and the second non-foldable area NFA2 of the display module DM. Different from the first support layer SUP1 and the sub-cover layer SCV, the second support layer SUP2 may be rigid. For example, the second support layer SUP2 may include the same material, e.g., the stainless steel, as that of the first support layer SUP1. However, exemplary embodiments are not limited thereto, and the second support layer SUP2 may include a variety of metals, e.g., Invar.

The second support layer SUP2 may include a first plate PL1 and a second plate PL2 arranged in the first direction DR1. The first plate PL1 may be disposed to overlap the first non-foldable area NFA1 and may support the first non-foldable area NFA1. The second plate PL2 may be disposed to overlap the second non-foldable area NFA2 and may support the second non-foldable area NFA2. The first plate PL1 and the second plate PL2 may extend to the foldable area FA, but may be spaced apart from each other in the foldable area FA. For example, a distance in the first direction DR1 between the first plate PL1 and the second plate PL2 may be in a range from about 2.2 mm to about 2.6 mm.

The first plate PL1 and the second plate PL2 may be disposed to be adjacent to each other in the foldable area FA. The first plate PL1 and the second plate PL2 may support the lattice pattern LT of the first support layer SUP1 through which the first holes H1 are defined in the foldable area FA. Accordingly, when a pressure is applied from the above of the lattice pattern LT to the lattice pattern LT through which the first holes H1 are defined, deformation of the lattice pattern LT of the first support layer SUP1 through which the first holes H1 are defined may be prevented by the second support layer SUP2. In addition, the second support layer SUP2 may prevent components disposed thereon from being deformed due to components disposed thereunder.

A ninth adhesive layer AL9 may be disposed between the second support layer SUP2 and the sub-cover layer SCV. The second support layer SUP2 and the sub-cover layer SCV may be attached to each other by the ninth adhesive layer AL9. The ninth adhesive layer AL9 may be disposed in an area overlapping the first non-foldable area NFA1 and an area overlapping the second non-foldable area NFA2. The ninth adhesive layer AL9 may not be disposed in an area overlapping the foldable area FA.

The second support layer SUP2 may further include a heat dissipation layer RHL and an insulating tape ITP. The heat dissipation layer RHL may be disposed under the first plate PL1 and the second plate PL2. The heat dissipation layer RHL may be a graphitized polymer film. For example, the polymer film may be a polyimide film.

A tenth adhesive layer AL10 may be disposed between the second support layer SUP2 and the heat dissipation layer RHL. The second support layer SUP2 and the heat dissipation layer RHL may be attached to each other by the tenth adhesive layer AL10.

The insulating tape ITP may be disposed under the heat dissipation layer RHL. The insulating tape ITP may include an insulating material. An eleventh adhesive layer AL11 may be disposed between the insulating tape ITP and the heat dissipation layer RHL. The insulating tape ITP and the heat dissipation layer RHL may be attached to each other by the eleventh adhesive layer AL11.

The first to eleventh adhesive layers AL1 to AL11 may include a transparent adhesive such as a pressure sensitive adhesive (PSA) or an optically clear adhesive (OCA).

Figure 5:
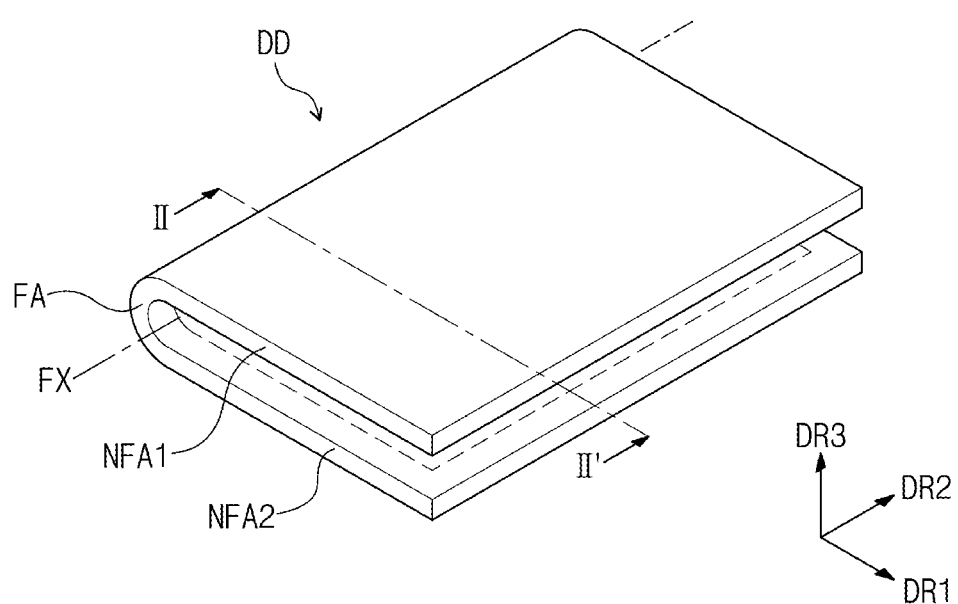
FIG. 5 is a perspective view of the display device of FIG. 1 illustrating an in-folded state thereof.
Figure 6:
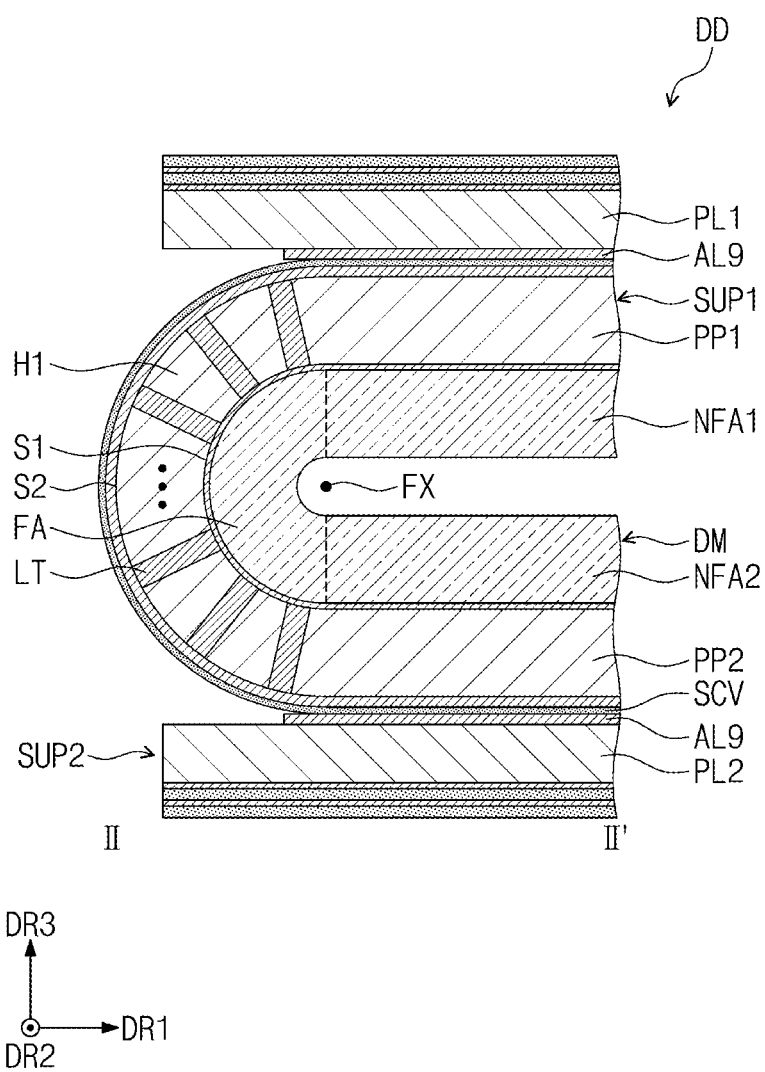
FIG. 6 is a cross-sectional view taken along a line II-II of FIG. 5.

FIG. 5 is a perspective view of the display device DD of FIG. 1 illustrating an in-folded state thereof, and FIG. 6 is a cross-sectional view taken along a line II-II of FIG. 5.

Referring to FIGS. 5 and 6, the display device DD may be a foldable display device DD that is folded. For example, the display device DD may be folded about a folding axis FX substantially parallel to the second direction DR2.

When the display device DD is folded about the folding axis FX, an upper surface of the first non-foldable area NFA1 and an upper surface of the second non-foldable area NFA2 of the display module DM may face each other. Thus, the display device DD may be inwardly folded (i.e., an in-folded state) such that the display surface DS (refer to FIG. 1) is not exposed to the outside.

In the illustrated exemplary embodiment, the display device DD is folded about the folding axis FX extending in the second direction DR2, however, exemplary embodiments are not limited thereto or thereby. The display device DD may be folded in different ways. For example, the display device DD may be folded about a folding axis extending in the first direction DR1.

Since the display module DM is the flexible display module, in the foldable area FA of the display module DM may be easily folded. The first support layer SUP1 and the sub-cover layer SCV, which are disposed under the display module DM, may be folded with the display module DM.

The second support layer SUP2 disposed under the sub-cover layer SCV is the rigid type, and thus, the second support layer SUP2 may not be folded. When the ninth adhesive layer AL9 is disposed up to the foldable area FA, the first and second plates PL1 and PL2 of the second support layer SUP2 may be attached to the sub-cover layer SCV in the foldable area FA. When the first and second plates PL1 and PL2 are attached to the sub-cover layer SCV in the foldable area FA, the foldable area FA of the display module DM may not be easily folded due to the first and second plates PL1 and PL2. Accordingly, it may be difficult for the display module DM to be folded. For example, in the unfolded state, the first plate PL1 and the second plate PL2 may overlap the foldable area FA of the display module DM in the third direction DR3 intersecting the first direction DR1, and in the folded state, the first plate PL1 and the second plate PL2 may not overlap the foldable area FA of the display module DM in the third direction DR3.

In the exemplary embodiment, the ninth adhesive layer AL9 may not be disposed in the area overlapping the foldable area FA. Accordingly, portions of the first and second plates PL1 and PL2 overlapping the foldable area FA are not attached to the display module DM, and thus, the foldable area FA of the display module DM may be easily folded.

The first support layer SUP1 may be easily folded with the display module DM by the lattice pattern LT overlapping the foldable area FA. When the first support layer SUP1 is folded, a first side S1 of the lattice pattern LT may be deformed in a concave shape in the first direction DR1. The first side S1 may be a portion adjacent to the folding axis FX in the lattice pattern LT. When the first support layer SUP1 is folded, a compressive stress may act on the first side S1. Accordingly, portions adjacent to the first side S1 in the first holes H1 may be compressed.

When the first support layer SUP1 is folded, a second side S2 of the lattice pattern LT may be deformed in a convex shape. The second side S2 may be opposite to the first side S1 and may be spaced further apart from the folding axis FX than the first side S1 is. When the first support layer SUP1 is folded, a tensile stress may act on the second side S2. Accordingly, portions adjacent to the second side S2 in the first holes H1 may be tensioned.

According to the exemplary embodiment, the display device DD may be unfolded to return to the shape shown in FIG. 1. In this case, the lattice pattern LT may be restored to its original shape. The folding and unfolding operations of the display device DD may be repeated several times. Therefore, the lattice pattern LT of the first support layer SUP1 needs to have appropriate stretching characteristics to facilitate the folding operation of the display device DD and appropriate durability so as not to be damaged during the repeated folding and unfolding operations.

Figure 7A:
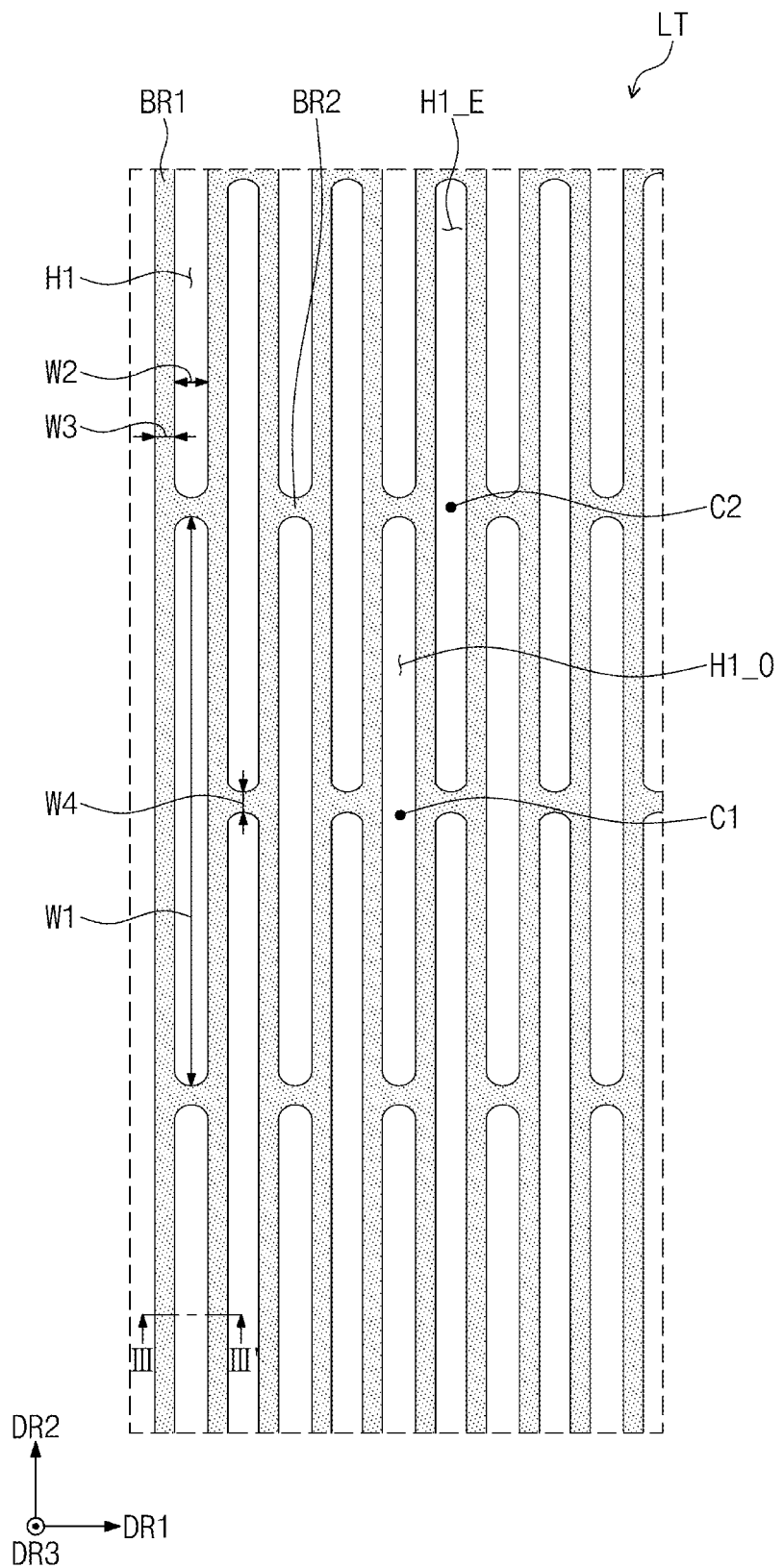
FIG. 7A is an enlarged plan view of a portion A of FIG. 2 illustrating an example of a lattice pattern of a support layer of the display device of FIG. 1.

FIG. 7A is an enlarged plan view of a portion A of FIG. 2 illustrating an example of a lattice pattern of a support layer of the display device of FIG. 1. FIG. 7A is an enlarged plan view showing a center portion of the lattice pattern LT of FIG. 2.

Referring to FIGS. 2 and 7A, the first holes H1 may be defined in the lattice pattern LT. The first holes H1 may be arranged in the first direction DR1 and the second direction DR2. The lattice pattern LT may include a plurality of first branches BR1 and a plurality of second branches BR2. The first branches BR1 may be disposed between the first holes H1 adjacent to each other in the first direction DR1. The first branches BR1 may be arranged in the first direction DR1. Each of the first branches BR1 may extend in the second direction DR2.

The second branches BR2 may be disposed between the first holes H1 adjacent to each other in the second direction DR2. The second branches BR2 may be disposed between the first holes H1 adjacent to each other in the first direction DR1. A thickness of a center portion of each second branch BR2 may be smaller than a thickness of an edge of the second branch BR2. The edge of the second branch BR2 means a portion thereof adjacent to the first branch BR1. Accordingly, opposite ends of the first hole H1 may have a convex shape in the second direction DR2.

Each of the second branches BR2 may extend in the first direction DR1. Each of the first holes H1 may be defined by two first branches BR1 adjacent to each other in the first direction DR1 and two second branches BR2 adjacent to each other in the second direction DR2.

The first holes H1 may be arranged in a zigzag form along the first direction DR1. In detail, center points of the first holes H1 adjacent to each other in the first direction DR1 may be spaced apart from each other by being alternatively shifted in the second direction DR2. For example, when one first hole among odd-numbered first holes arranged in the first direction DR1 is referred to as a first sample hole H1-O and one first hole among even-numbered first holes arranged in the first direction DR1 is referred to as a second sample hole H1-E, the first sample hole H1-O and the second sample hole H1-O may be disposed adjacent to each other. A first center point C1 of the first sample hole H1-O may be spaced apart from a second center point C2 of the second sample hole H1-E in the second direction DR2. The first center point C1 and the second center point C2 may define a center of the first sample hole H1-O and a center of the second sample hole H1-E, respectively.

Each of the first holes H1 may have a first width W1 and a second width W2. The first width W1 may be a width in the second direction DR2 of the first hole H1. The second width W2 may be a width in the first direction DR1 of the first hole H1.

The first width W1 may be in a range from about 2,000 µm to about 9,000 µm, and preferably, from about 3,500 µm to about 6,000 µm. In the illustrated exemplary embodiment, the first width W1 may be about 5,350 µm.

The second width W2 may be in a range from about 100 µm to about 250 µm, and preferably, from about 100 µm to about 200 µm. In the illustrated exemplary embodiment, the second width W2 may be about 150 µm.

Each of the first branches BR1 may have a third width W3 in the first direction DR1. The third width W3 may indicate a distance between the first holes H1 adjacent to each other in the first direction DR1. The third width W3 may be a maximum width in the first direction DR1 of the first branch BR1. The third width W3 may be in a range from about 100 µm to about 200 µm, and preferably, from about 93 µm to about 180 µm. In the illustrated exemplary embodiment, the third width W3 may be about 100 µm.

Each of the second branches BR2 may have a fourth width W4 in the second direction DR2. The fourth width W4 may indicate a distance between the first holes H1 adjacent to each other in the second direction DR2. The fourth width W4 may be in a range from about 121 µm to about 200 µm. In the illustrated exemplary embodiment, the fourth width W4 may be about 200 µm.

Figure 7B:
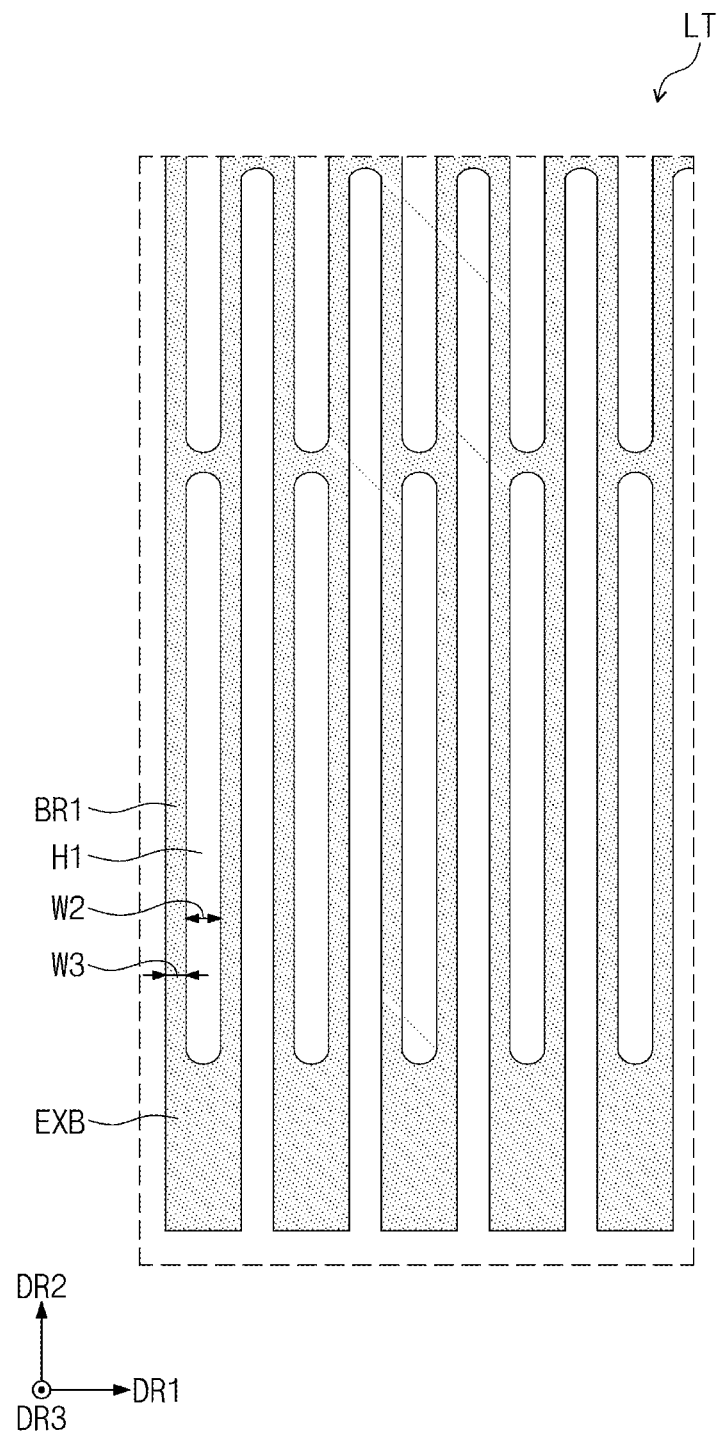
FIG. 7B is an enlarged plan view of a portion B of FIG. 2 illustrating the lattice pattern of the support layer of the display device of FIG. 1.

FIG. 7B is an enlarged plan view of a portion B of FIG. 2 illustrating the lattice pattern of the support layer of the display device FIG. 1. FIG. 7B is an enlarged plan view showing an edge of the lattice pattern LT of FIG. 2.

Referring to FIGS. 2 and 7B, the lattice pattern LT may include a plurality of extension branches EXB. The extension branches EXB may be disposed adjacent to opposite ends of the first branches BR1 in the second direction DR2. The extension branches EXB may be arranged in the first direction DR1. Each of the extension branches EXB may extend in the second direction DR2. The extension branches EXB may be spaced apart from each other in the first direction DR1.

In detail, each of the extension branches EXB may extend from two first branches BR1 adjacent to each other in the first direction DR1. A width in the first direction DR1 of each extension branch EXB may be greater than the third width W3 of the first branch BR1 and the second width W2 of the first hole H1. For example, the width in the first direction DR1 of each extension branch EXB may be substantially the same as a sum of the width (i.e., a width that is two times the third width W3) of two first branches BR1 arranged in the first direction DR1 and the width (i.e., the second width W2) of the first hole H1.

FIG. 7B shows only the extension branches EXB arranged at one end of the lattice pattern LT, however, exemplary embodiments are not limited thereto, and the extension branches EXB may be arranged at the other end of the lattice pattern LT.

Figure 8:
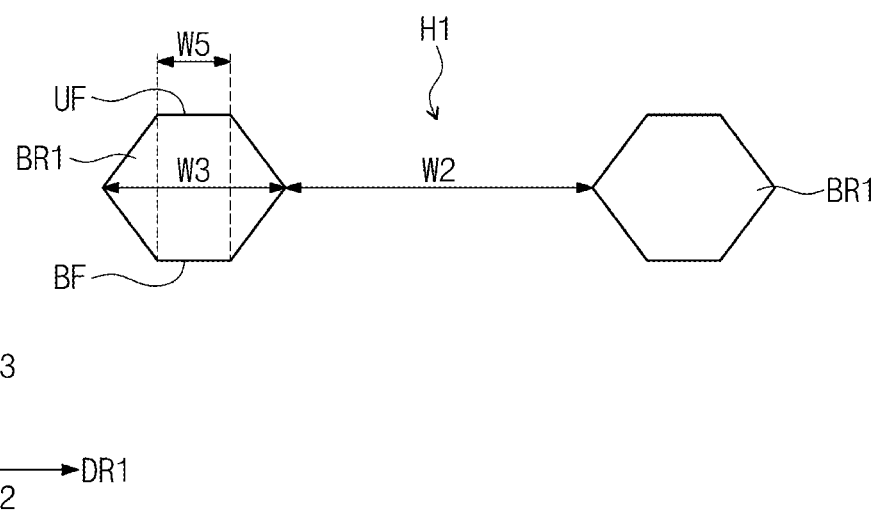
FIG. 8 is a cross-sectional view taken along a line shown in FIG. 7A.

FIG. 8 is a cross-sectional view taken along a line shown in FIG. 7A. FIG. 8 shows the first branches BR1 adjacent to each other and the first hole H1 defined between the first branches BR1 when viewed in the second direction DR2.

Referring to FIG. 8, each of the first branches BR1 has a hexagonal shape in a cross-section. In detail, the first branch BR1 may include an upper surface UF and a lower surface BF. The upper surface UF and the lower surface BF may be substantially parallel to the first direction DR1. The upper surface UF may have a fifth width W5 in the first direction DR1. The fifth width W5 may be smaller than the third width W3. A ratio of the fifth width W5 to the third width W3 may be variable. For example, the ratio of the fifth width W5 to the third width W3 may be greater than or equal to about 0.4 and smaller than about 1. As the ratio of the fifth width W5 to the third width W3 increases, the stress acting on the lattice pattern LT may increase during the folding and unfolding operations. The fifth width W5 may be in a range from about 40 µm to about 150 µm. In the illustrated exemplary embodiment, the fifth width W5 may be about 40 µm.

However, the shape of the first branches BR1 is not limited thereto or thereby. For example, when the ratio of the fifth width W5 to the third width W3 is about 1, the third width W3 and the fifth width W5 may be substantially the same as each other. In this case, each first branch BR1 may have a rectangular shape in a cross-section.

Figure 9:
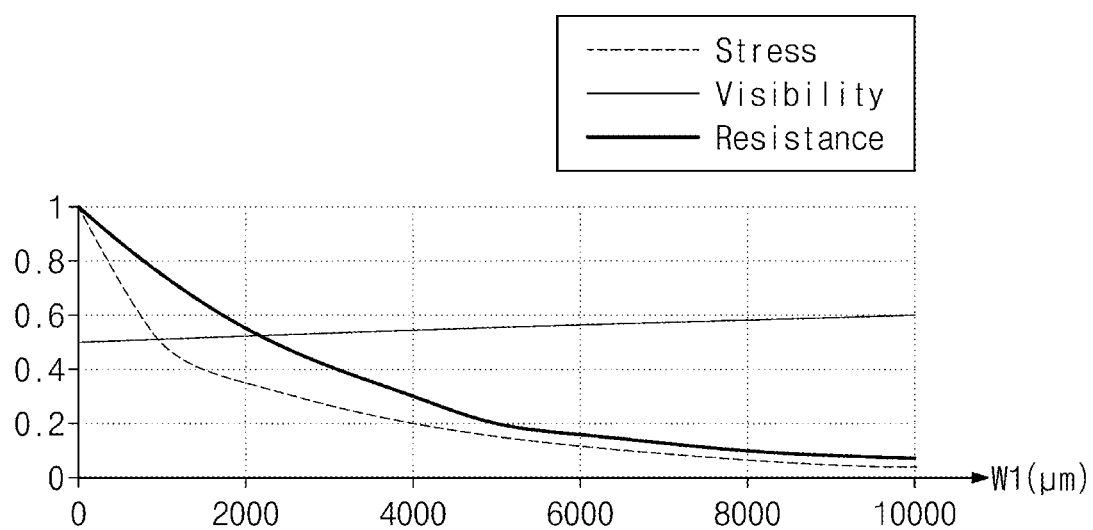
FIGS. 9 to 11 are graphs showing effects observed according to a variation in shape of a first hole of a lattice pattern in FIG. 7A.
Figure 10:
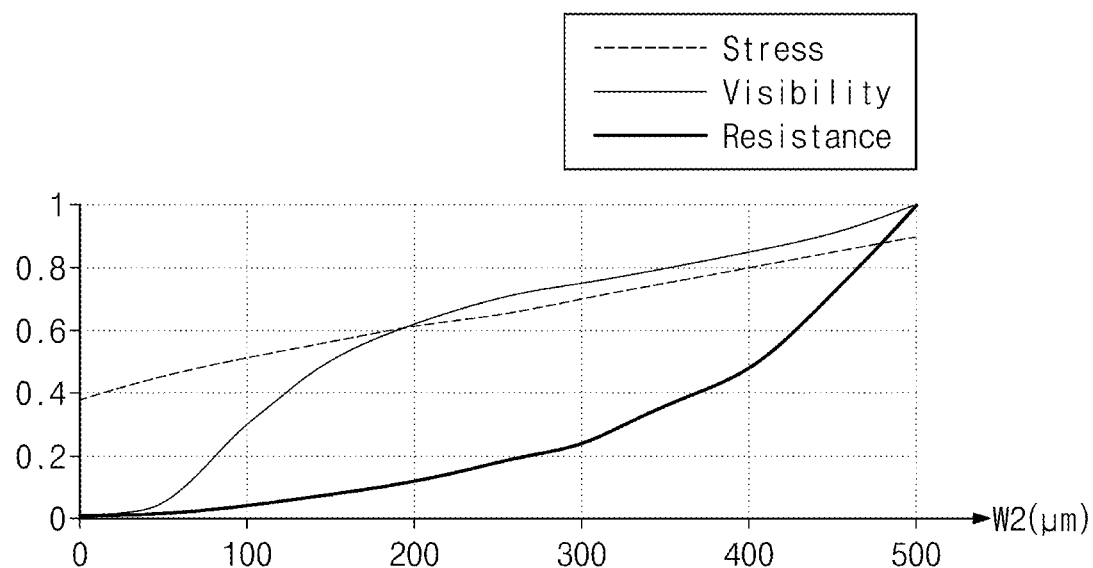
Figure 11:
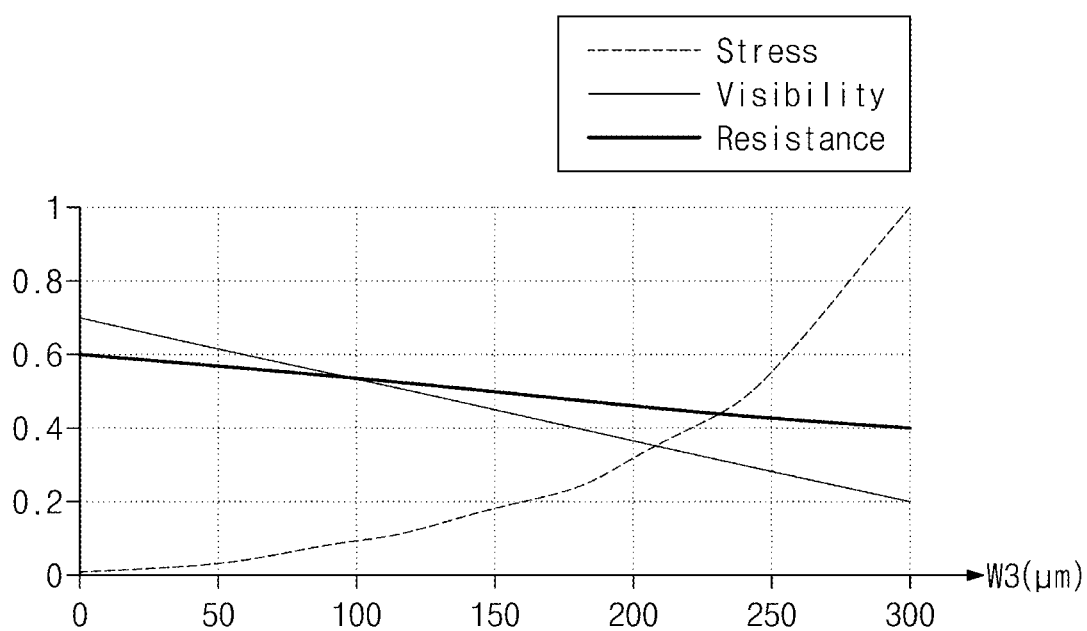

FIGS. 9 to 11 are graphs showing effects observed according to a variation in shape of the first hole of the lattice pattern of FIG. 7A. In FIGS. 9 to 11, the stress acting on the lattice pattern LT is indicated by a dotted line, a visibility of the lattice pattern LT is indicated by a solid line, and a resistance of the lattice pattern LT is indicated by a bold solid line. In FIGS. 9 to 11, an x-axis unit is micrometer (µm). In addition, a y-axis represents a relative value based on the assumption that a value at a certain time point is 1.

The stress means a load acting on the lattice pattern LT when the display device DD is folded. In detail, the stress may be the tensile stress acting on the second side S2 shown in FIG. 6. As the stress acting on the lattice pattern LT decreases, the folding and unfolding operations of the display device DD may be easily performed.

The visibility means a degree to which the lattice pattern LT is viewed when the display device DD is viewed in a plane. The smaller the visibility is, the better it is, since it is preferred that the lattice pattern LT is not viewed to the user.

The resistance means a property that the lattice pattern LT maintains its original shape against an external force. In other words, the resistance means a durability of the lattice pattern LT. For example, the external force may be gravity or pressure generated when the user touches the display device DD. When the resistance is too low, the lattice pattern LT may be recessed downwardly in the state that the display device DD is unfolded.

FIG. 9 shows variations of the stress, the visibility, and the resistance according to the first width W1. In FIG. 9, it is assumed that the stress and the resistance are one (1) when the first width W1 is zero (0).

Referring to FIGS. 7A and 9, in terms of the stress, as the first width W1 increases, the stress may decrease. This is because a deformable range in the first direction DR1 of the first hole H1 shown in FIG. 7A is proportional to the first width W1. Referring to FIG. 9, when the first width W1 is about 4,000 μm, the stress may be about 0.2. In other words, when the first width W1 is about 4,000 μm, the stress may decrease by about 80%.

In terms of the resistance, as the first width W1 increases, the resistance may decrease. That is, as the first width W1 increases, the lattice pattern LT may be easily deformed due to the external force. When the first width W1 is too large, the lattice pattern LT of the first support layer SUP1 may be recessed downwardly in the unfolded state of the display device DD. In this case, the first support layer SUP1 may not properly perform a function of supporting the display module DM. Accordingly, in the illustrated exemplary embodiment, the first width W1 may be equal to or smaller than about 9,000 μm.

In terms of the visibility, even though the first width W1 is changed, the visibility may not vary significantly.

Consequently, the first width W1 is preferably smaller in terms of the stress, but needs to be at least a predetermined width by taking into account a predetermined resistance, ease of manufacturing process, and a process error. The first width W1 may be in a range from about 2,000 μm to about 9,000 μm, preferably, from about 3,500 μm to about 6,000 μm. In the illustrated exemplary embodiment, the first width W1 may be about 5,350 μm.

FIG. 10 shows variations of the stress, the visibility, and the resistance according to the second width W2. In FIG. 10, it is assumed that the resistance and the visibility are one (1) and the stress has a maximum value when the second width W2 is 500 μm. In FIG. 10, the second width W2 is greater than zero (0), and stress, the visibility, and the resistance are not defined when the second width W2 is zero (0).

Referring to FIGS. 7A and 10, in terms of the stress, as the second width W2 decreases, the stress may decrease. This is because a larger number of the first holes H1 may be defined in the lattice pattern LT having a certain area when the second width W2, which is the width of the first hole H1 in the first direction DR1, decreases, and because the stress acting on the lattice pattern LT may be uniformly distributed as the number of the first holes H1 increases.

In terms of the visibility, the visibility may decrease as the second width W2 decreases. This is because the size of the first holes H1 gradually decreases as the second width W2 decreases.

In terms of the resistance, as the second width W2 decreases, the resistance may decrease. This is because the area of the first branches BR1 and the area of the second branches BR2 decrease in the lattice pattern LT as the number of the first holes H1 increases.

Consequently, the second width W2 is preferably smaller in terms of the stress and the visibility, but needs to be at least a predetermined width to secure a predetermined resistance and in consideration of ease of manufacturing process, and a process error. The second width W2 may be in a range from about 100 μm to about 250 μm, preferably, from about 100 μm to about 200 μm. In the illustrated exemplary embodiment, the second width W2 may be about 150 μm.

FIG. 11 shows variations of the stress, the visibility, and the resistance according to the third width W3. In FIG. 11, it is assumed that the stress is one (1) when the third width W3 is 300 μm. In FIG. 11, the third width W3 is greater than zero (0), and the stress, the visibility, and the resistance are not defined when the third width W3 is zero (0).

Referring to FIGS. 7A and 11, in terms of the stress, as the third width W3 decreases, the stress may decrease. This is because the deformation of the lattice pattern LT is facilitated and the stress is uniformly distributed to the first branches BR1 as the third width W3 of the first branches BR1 in the first direction DR1 decreases.

In terms of the visibility, the visibility may decrease as the third width W3 increases. This is because the proportion of external light blocked by the first branch BR1 increases.

In terms of the resistance, as the third width W3 increases, the resistance may decrease. This is because a crack is generated in the lattice pattern LT or the lattice pattern LT is disconnected as the third width W3 of the first branches BR1 in the first direction DR1 decreases.

Consequently, the third width W3 is preferably smaller in terms of the stress, but needs to be at least a predetermined width by taking into account the visibility, the resistance, and the process error. The third width W3 may be in a range from about 100 μm to about 200 μm, preferably, from about 93 μm to about 180 μm. In the illustrated exemplary embodiment, the third width W3 may be about 100 μm.

According to the exemplary embodiment, the first, second, and third widths W1, W2, and W3 of the lattice pattern LT may have the values in the above numerical ranges. The numerical ranges may be ranges derived from experimental data in consideration of the stretching characteristics and the durability of the lattice pattern LT suitable for the foldable display device DD (refer to FIG. 1). Accordingly, the first support layer SUP1 (refer to FIG. 2) may have the stretching characteristics suitable for the foldable display device and may have appropriate durability so as not to be damaged during the repeated folding and unfolding operations.

Figure 12:
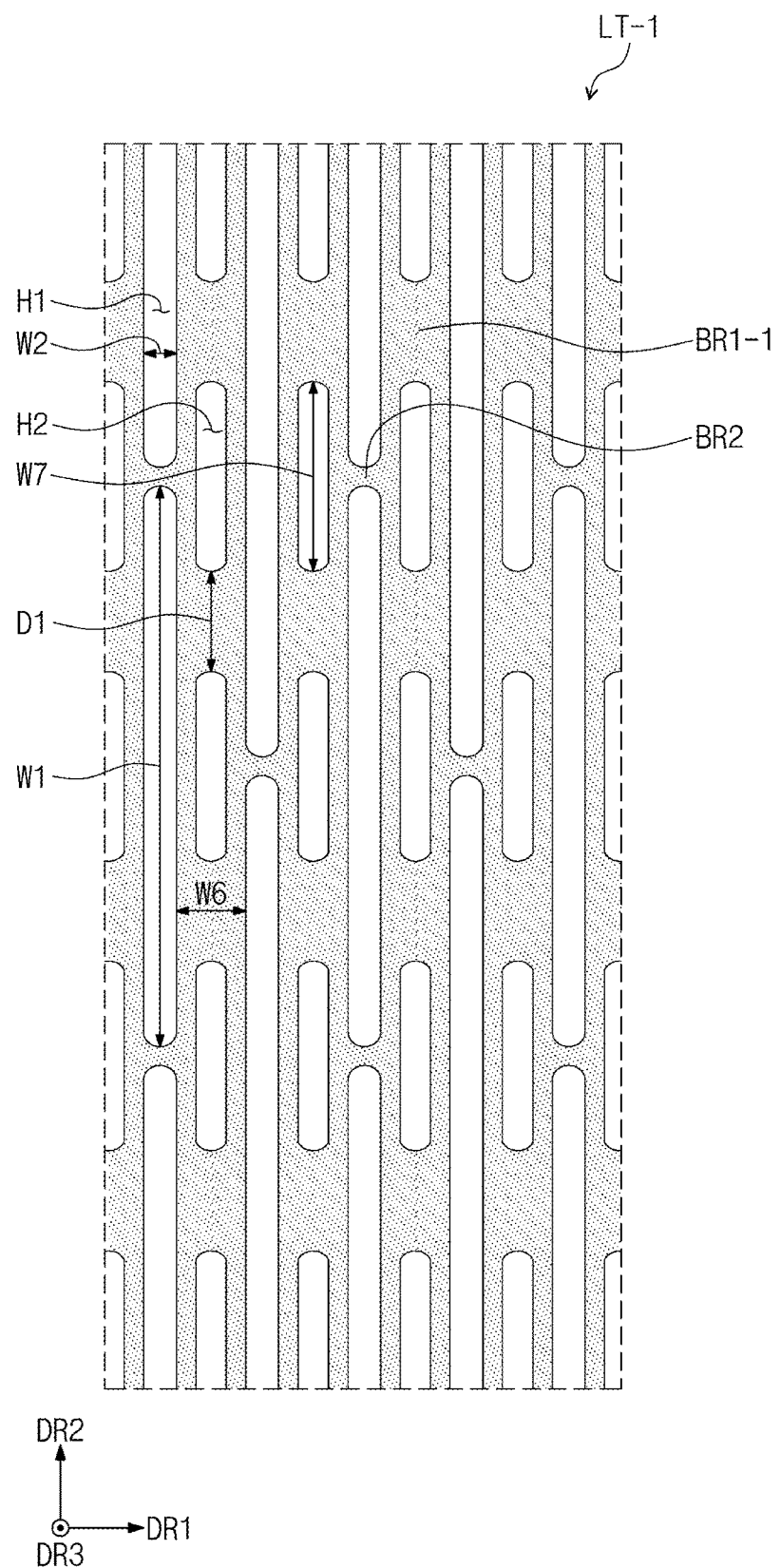
FIG. 12 is a plan view of the portion A of FIG. 2 illustrating another example of the lattice pattern of the support layer of the display device of FIG. 1.

FIG. 12 is a plan view of the portion A of FIG. 2 illustrating another example of the lattice pattern of the support layer of the display device of FIG. 1. FIG. 12 shows a lattice pattern LT-1 having a shape different from the lattice pattern LT shown in FIG. 7A. In FIG. 12, the same reference numerals denote the same elements in the above-described embodiments, and thus, detailed descriptions of the same elements will be omitted and different features will be mainly described.

Referring to FIG. 12, a plurality of first holes H1 and a plurality of second holes H2 may be defined through the lattice pattern LT-1. The second holes H2 may be arranged in the first direction DR1 and the second direction DR2. In detail, the second holes H2 arranged in the first direction DR1 may be disposed between the first holes H1 adjacent to each other in the first direction DR1. The second holes H2 arranged in the second direction DR2 may be defined by first branches BR1-1.

In the illustrated exemplary embodiment, a sixth width W6 in the first direction DR1 of the first branch BR1-1 may be greater than the third width W3 of the above-described embodiment (referring to FIGS. 7A and 7B). The sixth width W6 may be greater than the second width W2 of the first hole H1.

The second holes H2 may have a seventh width W7 in the second direction DR2. The seventh width W7 may be smaller than the first width W1. For example, the seventh width W7 may be equal to or greater than about 2,000 μm and smaller than the first width W1. A distance D1 between the second holes H2 adjacent to each other in the second direction DR2 may be smaller than the first width W1.

The second holes H2 may be arranged in the first direction DR1 to be substantially parallel to each other. For example, center points of the second holes H2 adjacent to each other in the first direction DR1 may be disposed at the same position in the second direction DR2.

Consequently, the first holes H1 may be arranged in a zigzag shape along the first direction DR1 in the lattice pattern LT-1, and the second holes H2 may be arranged in the first direction DR1 to be substantially parallel to each other. As described above, since the first holes H1 and the second holes H2 having the width different from that of the first holes H1 in the second direction DR2 are asymmetrically arranged in the lattice pattern LT-1, the lattice pattern LT-1 may have the stretching characteristics suitable for the foldable display device DD.

According to the illustrated exemplary embodiment, as the sixth width W6 of the first branch BR1-1 of the lattice pattern LT is designed to be greater than the second width W2 of the first hole H1, the durability of the lattice pattern LT-1 may be improved.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Therefore, the disclosed subject matter should not be limited to any single embodiment described herein, and the scope of the present inventive concept shall be determined according to the attached claims.

What is claimed is:

1. A display device comprising:
a display module having a first non-foldable area, a foldable area, and a second non-foldable area, which are arranged in a first direction in a unfolded state; and
a first support layer disposed under the display module and having a lattice pattern including a plurality of first holes overlapping the foldable area,
wherein the first holes are arranged in the first direction and a second direction intersecting the first direction, wherein:
each of the first holes has a first width in the second direction and a second width in the first direction,
the first width is about 5,500 μm, and
the second width is about 150 μm, and
wherein the lattice pattern comprises:
a plurality of first branches disposed between the first holes adjacent to each other in the first direction and extending in the second direction; and
a plurality of second branches disposed between the first holes adjacent to each other in the second direction and extending in the first direction,
wherein each of the first branches has a third width in the first direction, and
wherein the third width is about 100 μm.

2. The display device of claim 1, wherein an end of the first supporting layer protrudes outward beyond an end of the display module.

3. The display device of claim 1, wherein:
each of the second branches has a fourth width in the second direction, and
the fourth width is in a range from about 121 μm to about 200 μm.

4. The display device of claim 1, wherein each of the first branches has a hexagonal shape in a cross-section when viewed in the second direction.

5. The display device of claim 1, wherein the first support layer comprises a metal material.

6. The display device of claim 1, wherein the first support layer comprises:
a first portion disposed under the first non-foldable area and extending in the first direction from the lattice pattern; and
a second portion disposed under the second non-foldable area and extending in the first direction from the lattice pattern.

7. The display device of claim 1, wherein center points of the first holes adjacent to each other in the first direction are shifted in the second direction and spaced apart from each other.

8. The display device of claim 1, further comprising a second support layer disposed under the first support layer, wherein the second support layer comprises:
a first plate overlapping the first non-foldable area; and
a second plate overlapping the second non-foldable area and spaced apart from the first plate in the first direction.

9. The display device of claim 8, further comprising a sub-cover layer disposed between the first support layer and the second support layer and folded or unfolded integrally with the first support layer.

10. The display device of claim 1, wherein the display module is inwardly folded such that an upper surface of the first non-foldable area and an upper surface of the second non-foldable area face each other when the display module is folded about a folding axis in the foldable area.

11. A display device comprising:
a display module having a first non-foldable area, a foldable area, and a second non-foldable area, which are arranged in a first direction in a unfolded state; and
a first support layer disposed under the display module and having a lattice pattern including a plurality of first holes overlapping the foldable area,
wherein the first holes are arranged in the first direction and a second direction intersecting the first direction, and wherein:
each of the first holes has a first width in the second direction and a second width in the first direction,
the first width is in a range from about 2,000 μm to about 9,000 μm, and
the second width is in a range from about 100 μm to about 150 μm,
wherein the lattice pattern comprises:
a plurality of first branches disposed between the first holes adjacent to each other in the first direction and extending in the second direction; and a plurality of second branches disposed between the first holes adjacent to each other in the second direction and extending in the first direction, wherein each of the first branches has a hexagonal shape in a cross-section when viewed in the second direction, and wherein a width of an upper surface of the first branch is equal to a width of a lower surface of the first branch when viewed in the second direction, and the width of the upper surface of the first branch is smaller than a third width corresponding to a width of a center portion of the first branch.

12. A display device comprising:
a display module having a first non-foldable area, a foldable area, and a second non-foldable area, which are arranged in a first direction in a unfolded state; and
a first support layer disposed under the display module and having a lattice pattern including a plurality of first holes overlapping the foldable area,
wherein the first holes are arranged in the first direction and a second direction intersecting the first direction,
wherein each of the first holes has a first width in the second direction and a second width in the first direction,
wherein the first width is in a range from about 2,000 μm to about 9,000 μm,
wherein the second width is in a range from about 100 μm to about 150 μm, and
wherein a plurality of second holes is further defined in the lattice pattern, the second holes are arranged in the first direction and the second direction and disposed between the first holes adjacent to each other in the first direction, and a width of each second hole in the second direction of each of the second holes is smaller than the first width of each first hole in the second direction.

13. The display device of claim 12, wherein the lattice pattern comprises a plurality of first branches disposed between the first holes adjacent to each other in the first direction and extending in the second direction, the second holes arranged in the second direction are defined in each of the first branches, and a width of each first branch in the first direction is greater than the second width of each first hole in the first direction.

14. The display device of claim 12, wherein a distance between the second holes adjacent to each other in the second direction is smaller than the first width of each first hole in the second direction.

15. The display device of claim 12, wherein center points of the second holes adjacent to each other in the first direction are disposed at same positions in the second direction.

* * * * *